United States Patent Office 3,433,719
Patented Mar. 18, 1969

3,433,719

PLATING PROCESS FOR PRINTED CIRCUIT BOARDS

John Haskell Jones, Milan, Mo., assignor to Melpar, Inc., Falls Church, Va., a corporation of Delaware No Drawing. Filed Nov. 26, 1965, Ser. No. 510,053
U.S. Cl. 204—15 8 Claims
Int. Cl. C23b 5/50

ABSTRACT OF THE DISCLOSURE

In a process for electrically interconnecting conductive circuit strata of multilayer circuitry in which the various strata are separated by insulative planes, thru-holes are provided between the strata, the walls of the holes seeded with a thin film of conductive material, and successive layers of conductive material then deposited on the seeded layer in such manner that adjacent layers have different grain configurations.

The present invention relates generally to the manufacture of printed circuit boards and more particularly to processes for electro-chemical deposition of conductive coatings on surfaces of printed circuit boards and/or thru-holes therein to provide conductive connections having high strength-to-thickness ratios which have not previously been attainable using conventional electrodeposition techniques.

In one well-known method of plating thru-holes in printed circuit boards the insulating or dielectric board having appropriate conductive patterns at various planes thereof is provided with thru-holes which are subsequently coated with a suitable adhesive after which a thin film of copper is deposited or seeded over the wall surfaces of the thru-holes. Areas other than those which are to be plated are, of course, suitably masked or otherwise covered with plating resist and the holes then copper plated to build up a relatively thick layer for provision of the desired interface connections between conductor patterns. The resist on the remaining surface areas is then removed, usually after electroplating a protective layer such as gold, silver, or solder on appropriate portions of the exterior conductor patterns and interface connections.

As is most often the case in the production of both conventional and multi-layer printed circuit boards the required thru-holes are drilled, seeded and plated after the surface conductor patterns have been provided, the thru-hole plating supplying electrical connections to lands or pads within the conductor configurations. Unfortunately, in the above-described processes and in other conventional processes and techniques of manufacturing printed circuit boards with interface (thru-hole) connections, the final board is quite often unreliable when the circuitry is subjected to a wide range of stresses under environmental conditions such as may be encountered, for example, in space flights. It has been found that hairline fractures and other breaks frequently occur at the interface connection when the circuitry is subjected to such stresses, often rendering an entire system or subsystem of electronic circuitry unserviceable.

It is, accordingly, a primary object of the present invention to provide processes for manufacturing printed circuit boards wherein highly reliable interface connections are produced.

Of prime importance in the production of a reliable thru-hole plated board is the maintenance of the plating thickness within allowable limits or tolerances while simultaneously attempting to maximize the strength-to-thickness ratio so that the interface connections will withstand the projected or contemplated range of environmental stresses.

It is therefore another object of the present invention to provide processes for manufacturing thru-hole printed circuit boards in which reliable interface connections are achieved with significantly higher strength-to-thickness ratios than have heretofore been attainable.

Briefly, in accordance with the present invention the process steps involving thru-hole plating utilize the physics of grain size and orientation (granular structure of the metallic connecting layers) to permit realization of maximum strength in the final printed circuit structure. Unique mechanical properties as well as chemical affinity are achieved in the conductive thru-hole coating by properly depositing the coating in layers of various grain sizes and grain configurations. To this end, the granular structure of the conductive plating is varied relative to depth of plating by electroplating the board from separate baths of different chemical solutions in sequential fashion, or by plating from a single bath with a preselected current density level that is varied with respect to time. In an exemplary process, electroplating of the thru-holes is accomplished by depositing the conductive material, such as copper, on the hole surfaces and along the boundaries of the lands or pads on the board surfaces in alternate sequence from acid copper solution and alkaline copper solution baths. During the plating process periodic reversal of the electrodeposition current is employed in a programmed sequence and plating thickness control is exercised by appropriate control of current density. By using plating baths of acid copper solution and alkaline copper solution in alternating sequence the granular structure of the interface connection is varied in the desired manner to provide a structural combination whose overall strength is substantially higher than that obtained by using either solution alone, much like the physical properties of an alloy. Unlike the latter, however, in accordance with the present invention a compound/mixture is achieved at the boundaries of successive layers of the thru-hole coating.

It is therefore a more specific object of the present invention to provide processes for producing plated thru-holes in printed circuit boards wherein selected grain structure is achieved in the interface connections by plating from acid and alkaline solutions of the desired conductive materials in an alternating sequence.

Another object of the present invention is to provide printed circuit boards with conductive connections having layers of selected metallic grain sizes and orientations to maximize the strength of the conductive pattern interconnections.

Still another object of the present invention is to provide thru-hole printed circuit boards having low thickness-high strength interface connections.

It is a further object of the present invention to provide processes for plating conventional and multilayer printed circuit boards with a plurality of conductive layers having different grain sizes and grain orientation for increasing the stress resistance of the conductive patterns and interface connections.

The above and still further objects, features and attendant advantages of the present invention will become apparent from a consideration of the following detailed description of an exemplary process.

The initial portion of the process is quite similar to that utilized in conventional printed circuit board manufacturing processes. The precut boards which may comprise, for example, a foil clad laminate such as glass epoxy are precleaned after the initial cutting of the material and drilling of the tooling holes. The boards are lightly sanded to remove the drilling burrs and degreased using conventional spray to remove shear oils. Each board is then alkaline cleaned and rinsed, after which it is immersed in a solution of ammonium persulfate for approximately 60 seconds to etch the foil, e.g. copper, surface. The boards are again rinsed and subjected to a solution of hydrochloric acid for approximately 60 seconds to remove the copper oxide. After further rinsing and drying the boards are ready for printing.

Each board is baked at approximately 150° F. for approximately 10 minutes and cooled prior to the next operation. The desired conductor configuration or pattern is printed preferably using a conventional photographic process, although other well known processes, such as silk screen printing, may also be used.

If multilayer boards are to be fabricated each board is now prepared for lamination. First the undeveloped portions of the copper are etched away, after which the boards are neutralized, rinsed and further cleaned in a conventional manner. Following a drying step the boards are laminated to produce the desired multilayer composite board.

Appropriately cut foil is laminated to the exterior surfaces of the multilayer board, as desired, and the required thru-holes drilled therein. Any burrs which may result from the drilling operation are removed preferably by gentle sanding so that no burrs are forced into the thru-holes.

At this point each multi-layer board may be ultrasonically cleaned, rinsed and dried in preparation for epoxy, etch of the thru-holes. After etching the boards are again rinsed and dried and suitably prepared for the copper strike or seeding of the thru-holes. Plating of the hole surfaces for approximately seven minutes at about 40 amperes per square foot provides a very adequate copper strike. Again the boards are rinsed, racked, cleaned and acid-etched in preparation for copper immersion. After rinsing the multi-layer boards are ready for plating of the thru-holes.

In accordance with my invention the walls of the thru-holes are alternately subjected to electrochemical deposition of conductive material in acid copper solution and alkaline copper solution baths to provide a plurality of layers of the conductive coating in various grain sizes and configurations. In this manner the interface connections, i.e. the thru-hole plating, attain mechanical properties as well as chemical affinity in a unique ratio of thickness-to-strength which to my knowledge has not heretofore been attainable through the use of conventional electro-deposition processes. By alternately plating from acid and from alkaline copper solutions the resulting interface connections are provided with desirable properties of an alloy, except that a compound/mixture is produced at the boundary of each layer of different grain size and orientation.

The following detailed example of the thru-hole plating will illustrate more clearly the manner in which the grain orientation and structure and grain boundaries of the interface connections are obtained. During the first copper plating step the multi-layer boards are subjected to a pyrophosphate dip for approximately two minutes, after which they are rinsed for some 60 seconds. Electrochemical deposition of metal on the thru-hole surfaces is accomplished by immersing the boards in a copper pyrophosphate bath, which is an alkaline copper solution, and electroplating for approximately 45 minutes using a direct current of about 40 amperes per square foot of surface to be plated. The boards are then subjected to ten minutes of electroplating at periodic reversal of the plating current. The use of the periodic-reversed electrodeposition in a programmed sequence is essential to providing the proper grain boundary. The boards are then rinsed and sanded for approximately 12 minutes, using about 320 grit paper on each side for six minutes. After further rinsing each board is checked for burr entrapment in the thru-holes.

The second copper plating step is accomplished, after the boards are racked, by subjecting them to alkaline cleaning, rinsing, and etching preferably using successive solutions of ammonium persulfate and hydrochloric acid, the latter to remove any copper oxide, with rinsing between each solution and thereafter. The boards are then plated in a copper sulfate bath, an acid copper solution, for approximately 30 minutes at 20 amperes per square foot of surface to be plated. Again the boards are rinsed, sanded, dried and the holes checked for burr entrapment in the previously described manner.

A third coating of copper is deposited on the first two layers of thru-hole plating in the preferred process according to my invention although this will usually depend upon a compromise between board cost and contemplated use, and it will be understood that the number of layers of thru-hole plating for the interface connections may be varied as desired for a particular application. In the preferred process the third copper plating is accomplished by subjecting the boards to a preliminary pyrophosphate dip for approximately two minutes, rinsing, and subsequent plating from a copper pyrophosphate bath for about 35 minutes at 40 amperes per square foot of surface to be plated. The plating current is periodically reversed during a ten minute period following the 35 minute period of direct current plating. The boards are again rinsed, sanded, rerinsed and dried and the holes checked for burrs.

The thru-hole plating and the lands or pads surrounding each thru-hole on the exterior surfaces of the board may be plated with a protective coating, such as gold, and undesired portions of the foil on the exterior surfaces of each board removed by etching in a conventional manner. Each board is then cleaned and electrically tested to complete the process.

The use of my alternate bath plating process produces a laminar grain structure, planar oriented in combination with a highly refined high yield grain structure in the thru-hole interconnection, which is capable of withstanding stresses substantially greater than those which caused failures at interface connections provided by the old methods. As previously mentioned, the desirable thru-hole plating layers of different grain size and orientation may also be provided by plating from a single bath with a current density level that is varied with respect to time.

I claim:

1. A process for providing electrical connections of high reliability between conductive patterns of a printed circuit board via thru-holes in said board, said process including the steps of seeding the walls of said thru-holes with a thin conductive film, and plating over said film with alternate layers of conductive material by electroplating from separate acid and alkaline solution of said conductive material in an alternating sequence, to provide consecutive layers of conductive material having different grain sizes and grain orientations.

2. The process according to claim 1 wherein said electroplating from said separate solutions is accomplished for preselected time intervals using direct plating current and for further preselected time intervals using periodic current reversal.

3. The process according to claim 2 wherein said acid solution comprises a copper sulfate bath.

4. The process according to claim 2 wherein said alkaline solution comprises a copper pyrophosphate bath.

5. In a process for electrically interconnecting conductor configurations at various planes of a multilayer printed circuit board via a predetermined pattern of holes in said board, the steps of electrochemically depositing conductive material on wall surfaces of said holes from separate acid and alkaline baths of said conductive material in an alternating sequence.

6. The process according to claim 5 wherein the electrochemical deposition from each bath is accomplished for a predetermined interval with a preselected direct plating current and for another predetermined interval with a programmed sequence of periodic reversals of said plating current.

7. The process according to claim 6 wherein said acid bath comprises a copper sulfate solution.

8. The process according to claim 6 wherein said alkaline bath comprises a copper pyrophosphate solution.

References Cited

UNITED STATES PATENTS

| | | | |
|---|---|---|---|
| 3,171,796 | 3/1965 | Stephens et al. | 204—15 |
| 2,848,359 | 8/1959 | Talmy | 204—15 |

FOREIGN PATENTS

| | | |
|---|---|---|
| 980,468 | 1/1965 | Great Britain. |

JOHN H. MACK, *Primary Examiner.*

T. TUFARIELLO, *Assistant Examiner.*